US007951878B2

(12) United States Patent
Just et al.

(10) Patent No.: US 7,951,878 B2
(45) Date of Patent: May 31, 2011

(54) HALOGEN-FREE FLAMEPROOF EPOXY RESIN FORMULATIONS

(75) Inventors: Berthold Just, Hamburg (DE); Holger Keller, Reppenstedt (DE); Manfred Doering, Woerth-Buechelberg (DE); Uwe Storzer, Karlsruhe (DE); Sebastian Seibold, Stutensee (DE)

(73) Assignee: Schill + Seilacher "Struktol" Aktiengesellschaft (DE)

( * ) Notice: Subject to any disclaimer, the term of this patent is extended or adjusted under 35 U.S.C. 154(b) by 631 days.

(21) Appl. No.: 11/916,435

(22) PCT Filed: Dec. 12, 2006

(86) PCT No.: PCT/EP2006/011956
§ 371 (c)(1),
(2), (4) Date: Dec. 3, 2007

(87) PCT Pub. No.: WO2007/118507
PCT Pub. Date: Oct. 25, 2007

(65) Prior Publication Data
US 2008/0200617 A1 Aug. 21, 2008

(30) Foreign Application Priority Data
Mar. 31, 2006 (DE) .......................... 10 2006 015 084

(51) Int. Cl.
*C08G 59/40* (2006.01)
*C08G 59/00* (2006.01)
*C08G 79/06* (2006.01)
*C08G 79/00* (2006.01)

(52) U.S. Cl. ........ 525/405; 525/403; 528/220; 528/230; 528/398; 528/403; 528/486; 528/487

(58) Field of Classification Search .................. 525/403, 525/405; 528/220, 230, 403, 486, 487, 398
See application file for complete search history.

(56) References Cited

U.S. PATENT DOCUMENTS

| | | | |
|---|---|---|---|
| 4,086,206 A | 4/1978 | Saito et al. | |
| 4,127,590 A | 11/1978 | Endo et al. | 260/936 |
| 4,529,533 A | 7/1985 | Chasar | 524/101 |
| 4,742,088 A | 5/1988 | Kim | 521/118 |
| 5,821,376 A | 10/1998 | Rathfelder et al. | 558/82 |
| 6,797,821 B2 | 9/2004 | Wang et al. | 544/195 |
| 7,115,765 B2 | 10/2006 | Sprenger et al. | 558/82 |
| 2002/0035233 A1 | 3/2002 | Wang et al. | |
| 2005/0038279 A1 | 2/2005 | Dittrich et al. | 558/97 |

FOREIGN PATENT DOCUMENTS

| | | |
|---|---|---|
| DE | 2 034 887 | 1/1972 |
| DE | 26 46 218 | 4/1977 |
| DE | 195 22 876 | 11/1996 |
| DE | 102 06 982 | 9/2003 |
| DE | 103 59 269 | 7/2005 |
| EP | 0 106 169 | 4/1984 |
| EP | 0 806 429 | 11/1997 |
| JP | 61-162541 | 7/1986 |
| JP | 2001-172555 | 6/2001 |
| JP | 2001-323268 | 11/2001 |
| JP | 2001 354685 | 12/2001 |
| JP | 2002-284850 | 10/2002 |
| JP | 2003-105058 | 4/2003 |
| WO | WO 02/14334 | 2/2002 |
| WO | WO 2004/024791 | 3/2004 |

OTHER PUBLICATIONS

Wang et al., Synthesis and properties of epoxy resins containing 2-(6-oxid-6H-dibenz(c,e)(1,2) oxaphosphorin-6-yl) 1,4-benzenediol (II), Department of Chemical Engineering, National Cheng Kung University, Polymer 41 (2000), pp. 3631-3638.
Shieh, et al., "Effect of the Organophosphate Structure on the Physical and Flame-Retardant Properties of an Epoxy Resin", Journal of Polymer Science, vol. 40, 369-378 (2002).
Liu et al., "Phosphorus-Containing Epoxy for Flame Retardant. III: Using Phosphorylated Diamines as Curing Agents", J. Appl. Polym Sci. 63: 895-901, 1997.
Liu et al., "Synthesis, Characterization, Thermal and Flame Retardant Properties of Phosphate-Based Epoxy Resins", J. Polym Sci A: Polym Chem 35: 565-574, 1997.
Levchik, et al., "Thermal Decomposition of Cyclotriphosphazenes. I. Alkyl-Aminoaryl Ethers", J. Appl. Polym Sci 67: 461-472, 1998.
Lu et al., "Recent developments in the chemistry of halogen-free flame retardant polymers", Prog. Polym Sci. 27: 1661-1712, 2002.
Levchik et al., "Epoxy resins cured with aminophenylmethylposphine oxide—II. Mechanism of thermal decomposition", Polymer Degradation and Stability 60, 169-183, 1998.
European Office Action dated Oct. 15, 2010 (4 pages).
Notice of Allowance in Applicants' related U.S. Appl. No. 10/598,012, filed Aug. 15, 2006 and allowed Nov. 17, 2010.
Toshio Koizumi, "Pd(0) catalyzed polyaddition of bifunctional vinyloxiranes with 1, 3-dicarbonyl compounds" Journal of Polymer Science: Part A: Polymer Chemistry, vol. 40, 2002, pp. 2487-2494.
International Preliminary Report on Patentability, PCT/Written Opinion of ISR Authority, Apr. 2005.
PCT International Search Report and Written Opinion, dated Mar. 7, 2006.

*Primary Examiner* — Duc Truong
(74) *Attorney, Agent, or Firm* — Hayes Soloway P.C

(57) ABSTRACT

The invention relates to a method for preparing halogen-free flameproof epoxy resins, in which a halogen-free epoxy resin is reacted with a polyfunctional aldehyde or ketone and a phosphinic acid derivative, wherein the phosphinic acid derivative contains at least one P—H-active structural unit of the formula =PH(O) and is used in an amount equivalent to the polyfunctionality of the aldehyde or ketone, to a halogen-free flameproof epoxy resin obtainable by this method, to the use of the epoxy resin as a base material for the manufacture of printed circuit boards and printed circuits and to intermediates used to prepare the epoxy resins.

22 Claims, No Drawings

HALOGEN-FREE FLAMEPROOF EPOXY RESIN FORMULATIONS

The invention relates to a method for preparing halogen-free flameproof epoxy resins, the halogen-free flameproof epoxy resins obtained according to this method and their use.

EP 0 806 429 A2 discloses halogen-free flameproof epoxy resins and phosphinic acid derivatives as halogen-free flameproofing agents for such epoxy resins and the use of halogen-free flameproof epoxy resins for the manufacture of prepregs and composite materials, fibers, nonwoven and woven fabrics, and printed circuit boards. A preferred phosphinic acid derivative known for these purposes is 9,10-dihydro-9-oxa-10-phospha-phenanthrene-10-oxide, which, in more previous references, is referred to as "DOP", in English references mostly as "DOPO".

DE 26 46 218 A1 discloses the reaction of DOPO with unsaturated mono- and dicarboxylic acids, anhydrides and esters of unsaturated carboxylic acids to prepare reactive flameproofing agents that may be introduced into the polymer chain during the polyester polymerization process.

WO 2004/024791 A1 discloses the addition of aldehydes and ketones to DOPO and other phosphinic acid derivatives to prepare amine curing agents for epoxy resins.

Flameproof epoxy resins have already been realized by reacting epoxides with diols prepared by esterifying phosphoric and phosphinic acid derivatives with hydroquinone (see, for example, US 2002/0035233 A1, Polymer 2000, no. 41, p. 3631; J. Polymer Sci., part A, 2002, vol. 40, p. 369).

The known methods outlined above yield only low phosphorus contents in the polyols intended for addition with epoxy resins. While, on the one hand, effective flameproofing requires a high phosphorus content, this should not affect or even destroy the physical properties of the polymerizate. One technical disadvantage of the previously known methods was that the components responsible for the flameproof properties could not be directly reacted with the epoxy resin to be made flameproof.

An object of the invention is to avoid the disadvantages of the known methods described above and provide novel means and ways of directly making epoxy resins flameproof by using polyfunctional phosphinic acid derivatives with a high phosphorus content.

According to the present invention, this object is solved by a method for preparing halogen-free flameproof epoxy resins, in which a halogen-free epoxy resin is reacted with a polyfunctional aldehyde or ketone and a phosphinic acid derivative, wherein the phosphinic acid derivative contains at least one P—H-active structural unit =PH(O) and is used in an amount equivalent to the polyfunctionality of the aldehyde or ketone.

The object of the invention is further solved by a halogen-free flameproof epoxy resin and reactive intermediates in the form of polyols obtainable by the method according to the present invention or a part of the same.

In addition, the subject matter of the invention is the use of an epoxy resin made or obtainable according to the present invention as a base material for the manufacture of printed circuit boards and printed circuits.

By means of the so-called Michael addition of P—H-active compounds containing the structural unit =PH(O) to at least difunctional aldehydes and ketones the corresponding polyfunctional alcohols or polyols are formed. These phosphorus-containing polyols may be added directly to the epoxy resins, optionally by using a catalyst such as tertiary phosphanes, tertiary amines or a salt of these tertiary phosphanes or amines.

Surprisingly, according to the present invention, the P—H-active compounds can be reacted with polyfunctional aldehydes and ketones directly in the epoxy resin, thus considerably simplifying the expenditure for process engineering and leading to a dramatic cost reduction when making epoxy resins flameproof.

Irrespective of performing a stepwise or one-pot reaction, the halogen-free flameproof epoxy resins obtained as final products each exhibit the same physical properties after having been cured in a common manner.

Since the polyfunctional alcohols obtained as intermediates each carry at least two phosphorus-containing groups, the phosphorus content of the flameproof epoxy resin, based on the oxirane equivalents of the epoxide, is correspondingly higher than in the known methods.

The method according to the present invention is now explained in detail by means of the following reaction scheme:

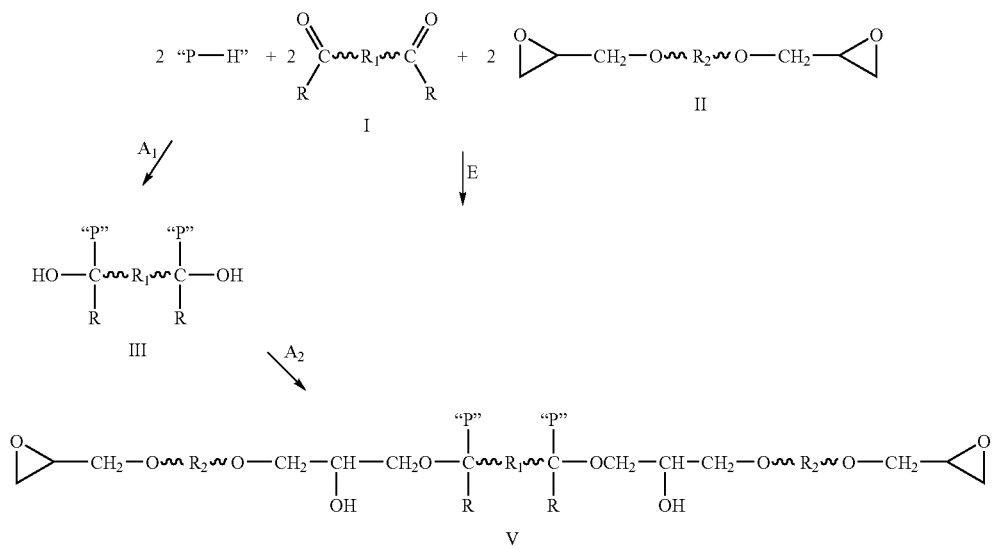

R=H, alkyl, aryl
R$_1$=alkylene, arylene, also substituted
R$_2$=bisphenylene propane, -methane, novolak, etc.

"P—H" =

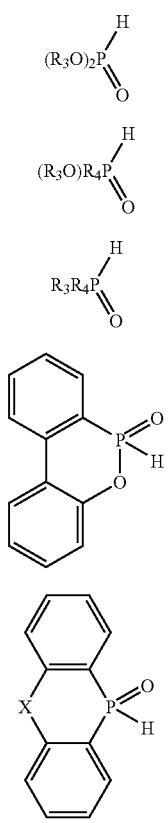

IV
X=O, NH, N-Alkyl, S, SO, SO$_2$, CO
R$_3$=alkyl, aryl
R$_4$=alkyl, aryl

In the reaction scheme, for a better understanding and an improved survey, a dialdehyde or diketone of the general formula I is reacted with a phosphinic acid derivative of the general formula "P—H" and at least one difunctional epoxy resin of the general formula 11 to form a flameproof modified epoxy resin of the general formula V.

The reaction by means of multiple condensation may be performed as a one-pot reaction (arrow E), in which all components are mixed simultaneously and react with each other, with the optional use of a catalyst.

Preferably, a tertiary phosphane, a tertiary amine or a salt of a tertiary phosphane or amine, in particular triphenylphosphine or triethanolamine, is used as a catalyst.

As an alternative, in a first step of the addition (arrow A$_1$), the P—H-active compound may be added to the aldehyde or ketone of formula I to form a diol (intermediate) of the general formula III, which—either with or without prior isolation—is then reacted in a second step (arrow A$_2$) with the at least difunctional epoxide of the general formula II to form the modified epoxide of the general formula V.

When using aldehydes and ketones of a higher functionality, a triol, tetrol or higher polyol that may be added to an epoxy resin that is at least difunctional and preferably of a higher functionality is correspondingly formed instead of a diol.

In the general formula I, R means hydrogen in the case of a dialdehyde, and a substituted or unsubstituted alkyl or aryl in the case of a diketone.

R$_1$ is a substituted or unsubstituted alkylene or arylene residue.

In the epoxide of the general formula II, R$_2$ means the residue of a bisphenylene methane, bisphenylene propane or a phenolic formaldehyde resin or novolak.

The phosphinic acid derivative "P—H" has one of the general formulas IVa, IVb, IVc, IVd or IVe, in which R$_3$ and R$_4$ are independently a substituted or unsubstituted alkyl or aryl residue and X is O, NH, N-alkyl, S, SO, SO$_2$ or CO, respectively.

While in the Michael addition of the P—H-active compound to aldehydes and ketones each carbonyl oxygen atom is converted into a hydroxyl group and, at the same time, a carbon-phosphorus single bond is formed at the carbonyl carbon atom, the addition of the diol or polyol to the oxirane ring of a glycidyl group of the epoxide forms a 2-hydroxypropylene ether group, with the modified epoxy resin still carrying reactive and thus curable terminal oxirane rings. The hydroxyl groups formed by the addition of the diol provide additional sites for cross-linking.

Reaction of the individual components is performed preferably at normal pressure and at a temperature between 100 and 160° C., more preferably at a temperature between 120 and 140° C.

Curing agents suitably used for the modified epoxy resins are dicyandiamide, 1,1-dimethyl-3-phenyl urea, also called "fenurone", diethylene toluene diamine (DETDA) and phenolic novolaks or a combination of two or more of these curing agents.

Preferably, phthaldialdehyde, terephthaldialdehyde, isophthaldialdehyde and 1,4-diacetylbenzene are used as polyfunctional aldehydes and ketones.

Preferably, DOPO is used as the P—H-active phosphinic acid derivative.

The epoxy resin made flameproof according to the present invention is preferably used as a base material for the manufacture of printed circuit boards, printed circuits, and electronic applications in general, as being halogen-free and flameproof is an advantage that is of special importance in the view of health, environmental and labor law, but also with respect to corrosion prevention and operating safety of electronic facilities and devices.

The invention is now further explained by means of the following examples:

Preparation of Flameproof Epoxy Resin Formulations

EXAMPLE 1-1

200 g of an epoxy novolak (DEN 438) is degassed and dried at 100° C. and 10$^{-2}$ hPa for 1 hour and then heated to 120° C. at room pressure. After reaching this temperature, 7.69 g of 9,10-dihydro-9-oxa-10-phosphanthrene-10-oxide (DOPO), 4.77 g of terephthaldialdehyde and 250 mg of triphenylphosphine are added. Now the bath temperature is slowly increased to 160° C. over 20 minutes and, after further 10 minutes, further 7.69 g of DOPO is added. The reaction mixture is maintained at 160° C. for further 60 minutes. After cooling to room temperature, a yellow solid epoxy resin with a phosphorus content of 1.0% is obtained.

Example 1-2

202.6 g of an epoxy novolak (DEN 438) is degassed and dried at 100° C. and 10$^{-2}$ hPa for 1 hour and then heated to 120° C. at room pressure. After reaching this temperature, 17.32 g of 9,10-dihydro-9-oxa-10-phosphanthrene-10-oxide (DOPO), 10.72 g of phthaldialdehyde and 250 mg of triphenylphosphine are added. Now the bath temperature is slowly increased to 160° C. over 20 minutes and, after further 10 minutes, again 17.32 g of DOPO is added. The reaction mixture is maintained at 160° C. for further 60 minutes. After cooling to room temperature, a yellow solid epoxy resin with a phosphorus content of 2.0% is obtained.

Example 1-3

208.0 g of an epoxy novolak (DEN 438) is degassed and dried at 100° C. and $10^{-2}$ hPa for 1 hour and then heated to 120° C. After reaching this temperature, 17.76 g of 9,10-dihydro-9-oxa-10-phosphanthrene-10-oxide (DOPO), 11.04 g of isophthaldialdehyde and 250 mg of triphenylphosphine are added. Now the bath temperature is slowly increased to 160° C. over 20 minutes and, after further 10 minutes, again 17.76 g of DOPO is added. The reaction mixture is maintained at 160° C. for further 60 minutes. After cooling to room temperature, a yellow solid epoxy resin with a phosphorus content of 2.0% is obtained.

Example 1-4

204.0 g of an epoxy novolak (DEN 438) is degassed and dried at 100° C. and $10^{-2}$ hPa for 1 hour and then heated to 120° C. After reaching this temperature, 17.64 g of 9,10-dihydro-9-oxa-10-phosphanthrene-10-oxide (DOPO), 13.24 g of 1,4-diacetylbenzene and 250 mg of triphenylphosphine are added. Now the bath temperature is slowly increased to 160° C. over 20 minutes and, after further 10 minutes, again 17.64 g of DOPO is added. The reaction mixture is maintained at 160° C. for further 60 minutes. After cooling to room temperature, a yellow solid epoxy resin with a phosphorus content of 2.0% is obtained.

Example 1-5

200 g of a bisphenol-A-bisglycidylether (DER 331) is degassed and dried at 100° C. and $10^{-2}$ hPa for 1 hour and then heated to 120° C. After reaching this temperature, 28.86 g of 9,10-dihydro-9-oxa-10-phosphanthrene-10-oxide (DOPO), 17.91 g of terephthaldialdehyde and 250 mg of triphenylphosphine are added. Now the bath temperature is slowly increased to 160° C. over 20 minutes and, after further 10 minutes, again 28.86 g of DOPO is added. The reaction mixture is maintained at 160° C. for further 60 minutes. After cooling to room temperature, a yellow viscous epoxy resin with a phosphorus content of 3.0% is obtained.

Example 1-6

200 g of an epoxy novolak (DEN 438) is degassed and dried at 100° C. and $10^{-2}$ hPa for 1 hour and then heated to 140° C. After reaching this temperature, 75.62 g of the adduct of 1 equivalent of terephthaldialdehyde and 2 equivalents of 9,10-dihydro-9-oxa-10-phosphanthrene-10-oxide (DOPO) and 300 mg of triethanolamine are added. Now the bath temperature is slowly increased to 160° C. over 20 minutes and kept there for further 60 minutes. After cooling to room temperature, a yellow solid epoxy resin with a phosphorus content of 3.0% is obtained.

Example 1-7

105.5 g of an epoxy novolak (DEN 438) is degassed and dried at 100° C. and $10^{-2}$ hPa for 1 hour and then heated to 120° C. After reaching this temperature, 16.90 g of diphenylphosphite, 9.68 g of terephthaldialdehyde and 1.60 g of triphenylphosphine are added. Now the bath temperature is slowly increased to 160° C. over 20 minutes and, after further 10 minutes, again 16.90 g of DOPO is added. The reaction mixture is maintained at 160° C. for further 60 minutes. After cooling to room temperature, a yellow-orange solid epoxy resin with a phosphorus content of 3.0% is obtained.

Example 1-8

100 g of an epoxy novolak (DEN 438) is degassed and dried at 100° C. and $10^{-2}$ hPa for 1 hour and then heated to 120° C. After reaching this temperature, 9.87 g of 2,8-dimethyl-phenoxaphosphine-10-oxide, 5.42 g of terephthaldialdehyde and 1.25 g of triphenylphosphine are added. Now the bath temperature is slowly increased to 160° C. over 20 minutes and, after further 10 minutes, 9.87 g of 2,8-dimethyl-anthracene-8-oxa-10-phosphine-10-oxide is added. The reaction mixture is maintained at 160° C. for further 60 minutes. After cooling to room temperature, a solid epoxy resin with a phosphorus content of 3.0% is obtained.

Curing of the Epoxy Resins

Example 2-1

135.0 g of the epoxy resin from Example 1-1 is homogenized and cured with 8.10 g of dicyandiamide (Dyhard 100 S from Degussa) and 1.35 g of fenurone (Dyhard UR 300 from Degussa) (2 h at 130° C., 2 h at 180° C.). The pure resin plate prepared this way is classified as V0 in the UL 94 test (plate thickness: 4 mm±1 mm). The glass transition temperature (TLC) was 181° C.

Example 2-2

117.0 g of the epoxy resin from Example 1-1 is homogenized and cured with 26.15 g of DETDA 80 (Lonza) (2 h at 140° C., 2 h at 200° C.). The pure resin plate prepared this way is classified as V0 in the UL 94 test (plate thickness: 4 mm±1 mm). The glass transition temperature (TLC) was 197° C.

Example 2-3

138.0 g of the epoxy resin from Example 1-1 is homogenized and cured with 72.5 g of phenolic novolak (PHS 6000 IZ 02 from Hexion) (2 h at 140° C., 2 h at 200° C.). The pure resin plate prepared this way is classified as V0 in the UL 94 test (plate thickness: 4 mm±1 mm).

Example 2-4

127.0 g of the epoxy resin from Example 1-2 is homogenized and cured with 24.05 g of DETDA 80 (Lonza) (2 h at 150° C., 2 h at 200° C.). The pure resin plate prepared this way is classified as V0 in the UL 94 test (plate thickness: 4 mm±1 mm). The glass transition temperature (TLC) was 170° C.

Example 2-5

122.0 g of the epoxy resin from Example 1-3 is homogenized and cured with 21.46 g of DETDA 80 (Lonza) (2 h at 140° C., 2 h at 200° C.). The pure resin plate prepared this way is classified as V0 in the UL 94 test (plate thickness: 4 mm±1 mm). The glass transition temperature (TLC) was 156° C.

Example 2-6

128.0 g of the epoxy resin from Example 1-4 is homogenized and cured with 22.43 g of DETDA 80 (Lonza) (2 h at 140° C., 2 h at 200° C.). The pure resin plate prepared this way is classified as V0 in the UL 94 test (plate thickness: 4 mm±1 mm). The glass transition temperature (TLC) was 167° C.

Example 2-7

83.75 g of the epoxy resin from Example 1-5 is homogenized and cured with 13.3 g of DETDA 80 (Lonza) (2 h at 140° C., 2 h at 200° C.). The pure resin plate prepared this way is classified as V0 (plate thickness: 4 mm±1 mm).

Example 2-8

86.5 g of the epoxy resin from Example 1-5 is homogenized and cured with 5.20 g of dicyandiamide (Dyhard 100 S from Degussa) and 0.85 g of fenurone (Dyhard UR 300 from Degussa) (2 h at 130° C., 2 h at 180° C.). The pure resin plate prepared this way is classified as V1 in the UL 94 test (plate thickness: 4 mm±1 mm).

The invention claimed is:

1. A method for preparing halogen-free flameproof epoxy resins, in which a halogen-free epoxy resin is reacted with a polyfunctional aldehyde or ketone and a phosphinic acid derivative, wherein the phosphinic acid derivative contains at least one P—H-active structural unit of the formula =PH(O) and is used in an amount equivalent to the polyfunctionality of the aldehyde or ketone.

2. The method of claim 1 wherein in a first step the polyfunctional aldehyde or the polyfunctional ketone is reacted with the phosphinic acid derivative to form a polyol, and in a second step said polyol is added to the epoxy resin.

3. The method of claim 1 wherein the epoxy resin is reacted in the presence of a catalyst.

4. The method of claim 3, wherein a tertiary phosphane or amine or a salt thereof is used as a catalyst.

5. The method of claim 4, wherein triphenylphosphine or triethanolamine is used as a catalyst.

6. The method of claim 1, wherein the components are reacted at normal pressure and at a temperature between 100 and 160° C.

7. The method of claim 1, wherein the flameproof epoxy resin obtained is cured using an amine curing agent.

8. The method of claim 7, wherein the amine curing agent is selected from the group consisting of dicyandiamide, 1,1-dimethyl-3-phenyl urea, diethylene toluene diamine and a phenolic novolak.

9. A halogen-free flameproof epoxy resin obtained by reacting a halogenfree epoxy resin with a polyfunctional aldehyde or ketone and a phosphinic acid derivative, wherein the phosphinic acid derivative contains at least one P—H-active structural unit of the formula =PH(O) and is used in an amount equivalent to the polyfunctionality of the aldehyde or ketone.

10. The epoxy resin of claim 9, wherein the polyfunctional aldehyde or the polyfunctional ketone is a difunctional compound of the formula I,

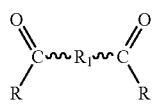
(I)

wherein R is a hydrogen atom or a substituted or unsubstituted alkyl or aryl group and $R_1$ is a substituted or unsubstituted alkylene or arylene group.

11. The epoxy resin of claim 10, wherein the aldehyde or the ketone is selected from the group consisting of phthaldialdehyde, terephthaldialdehyde, isophthaldialdehyde and 1,4-diacetylbenzene.

12. The epoxy resin of claim 9, wherein the halogen-free epoxy resin used as a starting material is a resin of the formula II,

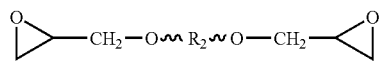
(II)

wherein $R_2$ is the residue of substituted or unsubstituted bisphenylene methane, bisphenylene propane, a phenolic formaldehyde resin or novolak.

13. The epoxy resin of claim 9, wherein the phosphinic acid derivative is a compound of the formulae IVa-IVe,

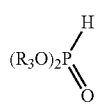
IVa

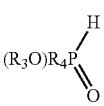
IVb

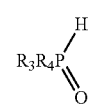
IVc

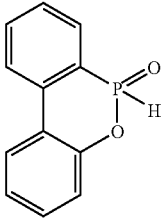
IVd

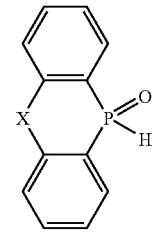
IVe wherein $R_3$ and $R_4$ are independently a substituted or unsubstituted alkyl or aryl residue and
X=O, NH, N-alkyl, S, SO, $SO_2$ or Co.

14. The epoxy resin of claim 13, wherein the phosphinic acid derivative is 9,10-dihydro-9-oxa-10-phospha-phenanthrene-10-oxide (DOPO).

15. The epoxy resin of claim 9, having the formula

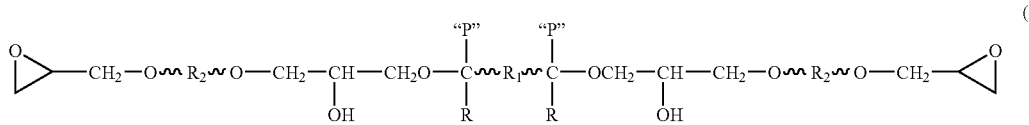
(V)

wherein R, $R_1$ and $R_2$ are each as defined in claim 9, and "P" is the residue of a phosphinic acid derivative of one of the formulas Iva-IVe:

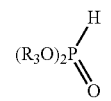

IVa

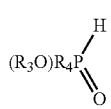

IVb

IVc

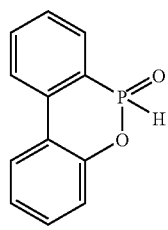

IVd

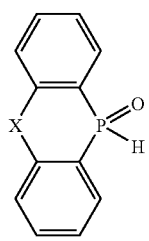

IVe wherein $R_3$ and $R_4$ are independently a substituted or unsubstituted alkyl or aryl residue and X=O, NH, N-alkyl, S, SO, $SO_2$ or Co, that is left after release of the hydrogen atom directly bound to the phosphorus atom.

16. The use of an epoxy resin of claim 9 as a base material for the manufacture of printed circuit boards and printed circuits.

17. An intermediate for the production of the epoxy resin of claim 10 obtained by the addition of a phosphinic acid derivative to a polyfunctional aldehyde or a polyfunctional ketone to form a polyol, wherein the phosphinic acid derivative contains at least one P—H-active structural unit of the formula =PH(O) and is used in an amount equivalent to the polyfunctionality of the aldehyde or ketone.

18. The intermediate of claim 17, wherein the polyfunctional aldehyde or the polyfunctional ketone is a difunctional compound of the formula I,

(I)

wherein R is a hydrogen atom or a substituted or unsubstituted alkyl or aryl group and $R_1$ is a substituted or unsubstituted alkylene or arylene group.

19. The intermediate of claim 18, wherein the aldehyde or the ketone is selected from the group consisting of phthaldialdehyde, terephthaldialdehyde, isophthaldialdehyde and 1,4-diacetylbenzene.

20. The intermediate of claim 17, wherein the phosphinic acid derivative is a compound of the formulas Iva-IVe,

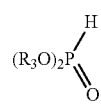

IVa

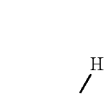

IVb

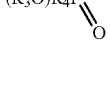

IVc

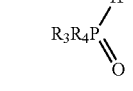

IVd

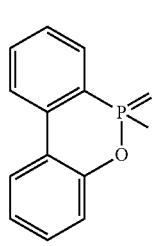

IVe wherein $R_3$ and $R_4$ are independently a substituted or unsubstituted alkyl or aryl residue and X=0, NH, N-alkyl, 5, SO, $SO_2$ or CO.

21. The intermediate of claim 20, wherein the phosphinic acid derivative is 9,10-dihydro-9-oxa-10-phospha-phenanthrene-10-oxide.

22. The method of claim 1, wherein the components are reacted at normal pressure and at a temperature between 120 and 140 C.

* * * * *